(12) United States Patent
Hickey et al.

(10) Patent No.: US 8,718,147 B2
(45) Date of Patent: May 6, 2014

(54) VIDEO COMPRESSION ALGORITHM

(75) Inventors: John Hickey, Ratoath (IE); Paul Hough, Limerick (IE)

(73) Assignee: Avocent Huntsville Corporation, Huntsville, AL (US)

( * ) Notice: Subject to any disclaimer, the term of this patent is extended or adjusted under 35 U.S.C. 154(b) by 1922 days.

(21) Appl. No.: 11/707,879

(22) Filed: Feb. 20, 2007

(65) Prior Publication Data

US 2007/0274382 A1   Nov. 29, 2007

Related U.S. Application Data

(60) Provisional application No. 60/774,186, filed on Feb. 17, 2006, provisional application No. 60/836,649, filed on Aug. 10, 2006, provisional application No. 60/836,930, filed on Aug. 11, 2006, provisional application No. 60/848,488, filed on Sep. 29, 2006.

(51) Int. Cl.
*H04N 7/12* (2006.01)

(52) U.S. Cl.
USPC ............ 375/240.23; 375/240.01; 375/240.26; 358/1.9; 358/1.15; 358/1.17

(58) Field of Classification Search
USPC ............ 375/240.01, 240.03, 240.26, 240.23; 345/503, 522; 358/1.9, 1.15, 1.17; 341/65, 67; 712/10, 11, 28
See application file for complete search history.

(56) References Cited

U.S. PATENT DOCUMENTS

| | | |
|---|---|---|
| 3,710,011 A | 1/1973 | Altemus et al. |
| 3,935,379 A | 1/1976 | Thornburg et al. |
| 4,005,411 A | 1/1977 | Morrin, II |
| 4,134,133 A | 1/1979 | Teramura et al. |
| 4,142,243 A | 2/1979 | Bishop et al. |
| 4,369,464 A | 1/1983 | Temime |
| 4,667,233 A | 5/1987 | Furukawa |
| 4,855,825 A | 8/1989 | Santamaki et al. |
| 4,873,515 A | 10/1989 | Dickson |
| 5,046,119 A | 9/1991 | Hoffert et al. |
| 5,300,949 A | 4/1994 | Rodriquez et al. |
| 5,325,126 A | 6/1994 | Keith |
| 5,339,164 A | 8/1994 | Lim |
| 5,379,071 A | 1/1995 | Parikh et al. |
| 5,465,118 A | 11/1995 | Hancock et al. |
| 5,497,434 A | 3/1996 | Wilson |
| 5,519,874 A | 5/1996 | Yamagishi et al. |
| 5,526,024 A | 6/1996 | Gaglianello et al. |

(Continued)

FOREIGN PATENT DOCUMENTS

| | | |
|---|---|---|
| EP | 0495490 | 7/1992 |
| EP | 0899959 | 3/1999 |

(Continued)

OTHER PUBLICATIONS

Chinese Appln. No. 03816346.2—Jun. 12, 2009 SIPO Office Action (Translation).

(Continued)

*Primary Examiner* — Thanhnga B Truong
(74) *Attorney, Agent, or Firm* — Davidson Berquist Jackson & Gowdey, LLP

(57) ABSTRACT

A video compression routine encodes pixels using frame location relationships by using packets with variable length opcode.

4 Claims, 19 Drawing Sheets

(56) References Cited

U.S. PATENT DOCUMENTS

| | | | |
|---|---|---|---|
| 5,572,235 A | 11/1996 | Mical et al. | |
| 5,630,036 A | 5/1997 | Sonohara et al. | |
| 5,664,029 A | 9/1997 | Callahan et al. | |
| 5,757,973 A | 5/1998 | Wilkinson | |
| 5,796,864 A | 8/1998 | Callahan | |
| 5,805,735 A | 9/1998 | Chen et al. | |
| 5,812,169 A | 9/1998 | Tai et al. | |
| 5,828,848 A | 10/1998 | MacCormack et al. | |
| 5,835,791 A | 11/1998 | Goff et al. | |
| 5,864,681 A | 1/1999 | Proctor et al. | |
| 5,867,167 A | 2/1999 | Deering | |
| 5,898,861 A | 4/1999 | Emerson et al. | |
| 5,937,176 A | 8/1999 | Beasley et al. | |
| 5,946,451 A * | 8/1999 | Soker | 358/1.9 |
| 5,968,132 A | 10/1999 | Tokunaga et al. | |
| 6,008,847 A | 12/1999 | Bauchspies | |
| 6,038,346 A | 3/2000 | Ratnakar | |
| 6,040,864 A | 3/2000 | Etoh | |
| 6,088,395 A | 7/2000 | Wang et al. | |
| 6,094,453 A | 7/2000 | Gosselin et al. | |
| 6,097,368 A | 8/2000 | Zhu et al. | |
| 6,124,811 A | 9/2000 | Acharya | |
| 6,154,492 A | 11/2000 | Araki et al. | |
| 6,195,391 B1 | 2/2001 | Hancock et al. | |
| 6,233,226 B1 | 5/2001 | Gringeri | |
| 6,243,496 B1 | 6/2001 | Wilkinson | |
| 6,304,895 B1 | 10/2001 | Schneider et al. | |
| 6,327,307 B1 | 12/2001 | Brailean et al. | |
| 6,360,017 B1 | 3/2002 | Chiu et al. | |
| 6,373,890 B1 | 4/2002 | Freeman | |
| 6,418,479 B1 | 7/2002 | Houssein et al. | |
| 6,453,120 B1 | 9/2002 | Takahashi | |
| 6,470,050 B1 | 10/2002 | Ohtani et al. | |
| 6,496,601 B1 | 12/2002 | Migdal et al. | |
| 6,512,595 B1 | 1/2003 | Toda | |
| 6,539,418 B2 | 3/2003 | Schneider et al. | |
| 6,542,631 B1 | 4/2003 | Ishikawa | |
| 6,574,364 B1 | 6/2003 | Economidis et al. | |
| 6,584,155 B2 | 6/2003 | Takeda et al. | |
| 6,640,145 B2 | 10/2003 | Hoffberg et al. | |
| 6,661,838 B2 | 12/2003 | Koga et al. | |
| 6,664,969 B1 | 12/2003 | Emerson et al. | |
| 6,701,380 B2 | 3/2004 | Schneider et al. | |
| 6,754,241 B1 | 6/2004 | Krishnamurthy et al. | |
| 6,829,301 B1 | 12/2004 | Tinker et al. | |
| 6,871,008 B1 | 3/2005 | Pintz et al. | |
| 6,898,313 B2 | 5/2005 | Li et al. | |
| 6,940,900 B2 | 9/2005 | Takamizawa | |
| 6,978,335 B2 | 12/2005 | Lee | |
| 7,006,700 B2 | 2/2006 | Gilgen | |
| 7,013,255 B1 | 3/2006 | Smith, II | |
| 7,031,385 B1 | 4/2006 | Inoue et al. | |
| 7,085,319 B2 | 8/2006 | Prakash et al. | |
| 7,093,008 B2 | 8/2006 | Agerholm et al. | |
| 7,143,432 B1 | 11/2006 | Brooks et al. | |
| 7,222,306 B2 | 5/2007 | Kaasila et al. | |
| 7,272,180 B2 | 9/2007 | Dambrackas | |
| 7,321,623 B2 | 1/2008 | Dambrackas | |
| 7,336,839 B2 | 2/2008 | Gilgen | |
| 7,373,008 B2 | 5/2008 | Clouthier et al. | |
| 7,457,461 B2 | 11/2008 | Gilgen | |
| 7,515,632 B2 | 4/2009 | Dambrackas | |
| 7,515,633 B2 | 4/2009 | Dambrackas | |
| 7,542,509 B2 | 6/2009 | Dambrackas | |
| 7,941,634 B2 * | 5/2011 | Georgi et al. | 712/10 |
| 2001/0043273 A1 | 11/2001 | Herrod et al. | |
| 2003/0048643 A1 | 3/2003 | Lin et al. | |
| 2003/0184960 A1 | 10/2003 | Ferguson | |
| 2003/0202594 A1 | 10/2003 | Lainema | |
| 2004/0062305 A1 * | 4/2004 | Dambrackas | 375/240.01 |
| 2004/0064198 A1 | 4/2004 | Reynolds et al. | |
| 2004/0122931 A1 | 6/2004 | Rowland et al. | |
| 2004/0228526 A9 | 11/2004 | Lin et al. | |
| 2004/0268012 A1 | 12/2004 | Ferguson | |
| 2005/0025248 A1 | 2/2005 | Johnson et al. | |
| 2005/0057777 A1 | 3/2005 | Doron | |
| 2005/0069034 A1 | 3/2005 | Dambrackas | |
| 2005/0089091 A1 | 4/2005 | Kim et al. | |
| 2005/0108582 A1 | 5/2005 | Fung | |
| 2005/0135480 A1 | 6/2005 | Li et al. | |
| 2005/0198245 A1 | 9/2005 | Burgess et al. | |
| 2005/0249207 A1 | 11/2005 | Zodnik | |
| 2005/0286790 A1 | 12/2005 | Gilgen | |
| 2006/0039404 A1 | 2/2006 | Rao et al. | |
| 2006/0092271 A1 | 5/2006 | Banno et al. | |
| 2006/0120460 A1 | 6/2006 | Gilgen | |
| 2006/0126718 A1 | 6/2006 | Dambrackas et al. | |
| 2006/0126720 A1 | 6/2006 | Dambrackas | |
| 2006/0126721 A1 | 6/2006 | Dambrackas | |
| 2006/0126722 A1 | 6/2006 | Dambrackas | |
| 2006/0126723 A1 | 6/2006 | Dambrackas | |
| 2006/0161635 A1 | 7/2006 | Lamkin et al. | |
| 2006/0203460 A1 | 9/2006 | Aviv | |
| 2006/0236347 A1 | 10/2006 | Holovacs | |
| 2007/0018407 A1 | 1/2007 | Shoemaker | |
| 2007/0019743 A1 | 1/2007 | Dambrackas | |
| 2007/0036303 A1 | 2/2007 | Lee et al. | |
| 2007/0165035 A1 | 7/2007 | Duluk et al. | |
| 2007/0206497 A1 | 9/2007 | Plamondon et al. | |
| 2007/0248159 A1 | 10/2007 | Dambrackas | |
| 2007/0253492 A1 | 11/2007 | Shelton et al. | |
| 2009/0290647 A1 | 11/2009 | Shelton et al. | |

FOREIGN PATENT DOCUMENTS

| | | |
|---|---|---|
| JP | 64-077374 | 9/1987 |
| JP | 63-108879 | 5/1988 |
| JP | 01-162480 | 6/1989 |
| JP | 01-303988 | 12/1989 |
| JP | H03-130767 | 4/1991 |
| JP | 08-033000 | 2/1996 |
| JP | 08-263262 | 10/1996 |
| JP | 09-233467 | 9/1997 |
| JP | 10-257485 | 9/1998 |
| JP | 11-203457 | 7/1999 |
| JP | 11-308465 | 11/1999 |
| JP | 11-313213 | 11/1999 |
| JP | 2001-169287 | 6/2001 |
| JP | 2002-165105 | 6/2002 |
| TW | 200423738 | 11/2004 |
| WO | WO 98/26603 | 6/1998 |
| WO | WO 00/11559 | 3/2000 |
| WO | WO 01/08017 | 2/2001 |
| WO | WO 01/15130 | 3/2001 |
| WO | WO 01/84291 | 11/2001 |
| WO | WO 02/062050 A2 | 8/2002 |
| WO | WO 2006/102613 | 9/2006 |

OTHER PUBLICATIONS

CN Appln. No. 200710167085.2—Jun. 26, 2009 SIPO Office Action.
EP Appln. No. 03818864.5—Aug. 24, 2009 EPO Office Action.
EP Appln. No. 06758646.7—May 8, 2009 EPO Office Action.
IL Appln. No. 171878—Apr. 28, 2009 Translation of Office Action.
Matsui et al., "High-speed Transmission of Sequential Freeze-pictures by Exchanging Changed Areas", IEEE Transactions on Communications, IEEE Service Center, Piscataway, NJ, vol. COM-29, No. 12, Dec. 1, 1981, XP002089584, ISSN: 0090-6778.
Thyagarajan K. S. et al., "Image Sequence Coding Using Interframe VDPCM and Motion Compensation", ICASSP, IEEE International Conference on Acoustics, Speech and Signal Processing—proceedings 1989 Publ. By IEEE, vol. 3, 1989, pp. 1858-1861, XP010082957.
U.S. Appl. No. 11/790,994—Jun. 2, 2009 PTO Office Action.
U.S. Appl. No. 11/819,047—Aug. 26, 2009 PTO Office Action.
U.S. Appl. No. 12/318,074—Sep. 14, 2009 PTO Office Action.
U.S. Appl. No. 60/795,577, filed Apr. 28, 2006, Shelton, Gary.
Chrysafis et al., "Line-Based, Reduced Memory, Wavelet Image Compression," Mar. 2000 [retrieved on Aug. 20, 2008], Retrieved from the internet: <http://sipi.usc.edu/~ortega/Students/chrysafi/doc/ChristosChrysafis_line_based_1_P2000.pdf>.
International Preliminary Examination Report in PCT Application No. PCT/US2003/030650, mailed Aug. 25, 2006.

(56) References Cited

OTHER PUBLICATIONS

International Search Report and Written Opinion mailed Sep. 4, 2008 in PCT/US07/10376.
Office Action Issued Aug. 5, 2008 in Japanese Patent Application No. 2006-271932.
Office Action Issued Jul. 11, 2006, in Japanese Patent Application No. 2006-024444.
Office Action issued Jul. 31, 2007 in Japanese Patent Application No. 2006-024444 (with English translation).
Office Action Issued Jul. 4, 2006, in Japanese Patent Application No. 2006-024442.
Office Action Issued Jul. 4, 2006, in Japanese Patent Application No. 2006-024443.
Office Action Issued Mar. 7, 2006, in Japanese Patent Application No. 2004-541433.
Office Action Issued Mar. 7, 2006, in Japanese Patent Application No. 2006-024442.
Office Action Issued Mar. 7, 2006, in Japanese Patent Application No. 2006-024443.
Office Action Issued Mar. 7, 2006, in Japanese Patent Application No. 2006-024444.
Official Action issued Dec. 9, 2008 in JP Appln. No. 2005-510478 [with English translation].
PCT International Search Report and Written Opinion mailed Jan. 3, 2006 in PCT/US05/17626, International filing date Jan. 3, 2006.
PCT International Search Report and Written Opinion mailed Oct. 25, 2005 in PCT/US05/19256, International filing date Oct. 25, 2005.
PCT International Search Report for PCT/US03/10488, mailed Jul. 28, 2003.
PCT International Search Report in PCT Application No. PCT/US2003/030650 mailed Apr. 20, 2006.
Search Report and Written Opinion mailed Aug. 26, 2008 in PCT Appln. No. PCT/US2006/021182.
U.S. Appl. No. 11/339,537—May 13, 2009 PTO Office Action.
U.S. Appl. No. 10/260,534, filed Oct. 1, 2002, Dambrackas.
U.S. Appl. No. 10/434,339, filed May 9, 2003, Dambrackas.
U.S. Appl. No. 10/629,855, filed Jul. 30, 2003, Johnson et al.
U.S. Appl. No. 10/875,678, filed Jun. 25, 2004, Gilgen.
U.S. Appl. No. 10/875,679, filed Jun. 25, 2004, Gilgen.
U.S. Appl. No. 11/282,688, filed Nov. 21, 2005, Dambrackas et al.
U.S. Appl. No. 11/339,537, filed Jan. 26, 2006, Dambrackas.
U.S. Appl. No. 11/339,541, filed Jan. 26, 2006, Dambrackas.
U.S. Appl. No. 11/339,542, filed Jan. 26, 2006, Dambrackas.
U.S. Appl. No. 11/340,476, filed Jan. 27, 2006, Dambrackas.
U.S. Appl. No. 11/528,569, filed Sep. 28, 2006, Dambrackas et al.
U.S. Appl. No. 11/707,863, filed Feb. 20, 2007, Hickey et al.
U.S. Appl. No. 11/707,880, filed Feb. 20, 2007, Hickey et al.
U.S. Appl. No. 11/819,047, filed Jun. 25, 2007, Dambrackas.
U.S. Appl. No. 11/889,268, filed Aug. 10, 2007, Hickey et al.
U.S. Appl. No. 60/774,186, filed Feb. 17, 2006, Hickey.
U.S. Appl. No. 60/836,649, filed Aug. 10, 2006, Hickey.
U.S. Appl. No. 60/836,930, filed Aug. 11, 2006, Hickey.
U.S. Appl. No. 60/848,488, filed Sep. 29, 2006, Hickey.
"Avocent Install and Discovery Protocol Specification," Version 1.3, Avocent Corporation Jul. 9, 2003 [30 pages].
"Avocent Secure Management Protocol Specification," Version 1.8, Avocent Corporation Apr. 8, 2005 [64 pages].
McCloghrie, K., "Management Information Base for Network Management of TCP/IP-based internets: MIB II," Network Working Group, Performance Systems International, Mar. 1991 [60 pages].
U.S. Appl. No. 11/707,879, filed Feb. 20, 2007, Hickey et al.
CA Appln. No. 2,524,001—Nov. 30, 2009 CIPO Office Action.
CA Appln. No. 2,524,001—Aug. 30, 2010 CIPO Office Action.
CA Appin. No. 2,627,037—Sep. 9, 2010 CIPO Office Action.
CN Appln. No. 200710167085.2—Aug. 6, 2010 SIPO Office Action.
IL Appln. No. 167787—Jul. 21, 2009 Office Action.
International Search Report and Written Opinion mailed Jul. 29, 2008 in PCT Application PCT/US07/17700.
International Search Report and Written Opinion mailed Sep. 14, 2010 in PCT Appln. No. PCT/US2010/001941.
JP Appln. No. 2005-510478—Jul. 7, 2009 Notice of Reasons for Rejection [English translation].
JP Appln. No. 2005-510478—Jul. 6, 2010 Decision of Rejection (English translation).
JP Appln. No. 2006-271932—Oct. 6, 2009 Office Action with English summary.
JP Appln. No. 2007-098267—Jul. 27, 2010 JPO Notice of Reasons for Rejection with translation.
Search Report and Written Opinion mailed Jul. 16, 2008 in PCT Appln. No. PCT/US2007/17699.
U.S. Appl. No. 11/282,688—Apr. 28, 2010 PTO Office Action.
U.S. Appl. No. 11/790,994—Feb. 2, 2010 PTO Office Action.
EP 07836655.6 Extended Search Report of Nov. 15, 2013.
EP Appln. No. 07836654.9—Jan. 8, 2013 EPO Extended European Search Report.
EP Appln. No. 07872608.0—Feb. 6, 2013 EPO Extended European Search Report.
Search Report and Written Opinion mailed Apr. 24, 2008 in International Application No. PCT/US2007/017701.
Search Report and Written Opinion mailed Jul. 14, 2008 in PCT Application No. PCT/US2007/017799.
TW Appln. No. 96127270—Apr. 19, 2013 Patent Office Official Letter.
U.S. Appl. No. 11/889,268—Nov. 17, 2009 PTO Office Action.
U.S. Appl. No. 11/889,268—Aug. 20, 2010 PTO Office Action.
U.S. Appl. No. 11/889,268—Sep. 15, 2010 PTO Office Action.
U.S. Appl. No. 11/889,268—Apr. 6, 2011 PTO Office Action.
U.S. Appl. No. 11/889,268—Feb. 1, 2012 PTO Office Action.
U.S. Appl. No. 11/889,268—Aug. 21, 2012 PTO Office Action.
U.S. Appl. No. 11/889,268—Apr. 2, 2013 PTO Office Action.

* cited by examiner

| 7 | 6 | 5 | 4 | 3 | 2 | 1 | 0 |
|---|---|---|---|---|---|---|---|
|   | 100 |   | 0 |   | Delta |   |   |

DELTA_NC (Uniform)

| 7 | 6 | 5 | 4 | 3 | 2 | 1 | 0 |
|---|---|---|---|---|---|---|---|
|   | 100 |   | 1 |   | Red |   |   |
|   |   | Blu |   |   | Grn |   |   |

DELTA_NC

| 7 | 6 | 5 | 4 | 3 | 2 | 1 | 0 |
|---|---|---|---|---|---|---|---|
|   | 101 |   | 0 |   | Delta |   |   |

DELTA_CL (Uniform)

| 7 | 6 | 5 | 4 | 3 | 2 | 1 | 0 |
|---|---|---|---|---|---|---|---|
|   | 101 |   | 1 |   | Red |   |   |
|   |   | Blu |   |   | Grn |   |   |

DELTA_CL

| 7 | 6 | 5 | 4 | 3 | 2 | 1 | 0 |
|---|---|---|---|---|---|---|---|
|   | 110 |   | 0 |   | Delta |   |   |

DELTA_CA (Uniform)

| 7 | 6 | 5 | 4 | 3 | 2 | 1 | 0 |
|---|---|---|---|---|---|---|---|
|   | 110 |   | 1 |   | Red |   |   |
|   |   | Blu |   |   | Grn |   |   |

DELTA_CA

} Delta Commands

Fig. 2
Prior Art

DVC Basic Header Format

| 7 | 6 | 5 | 4 | 3 | 2 | 1 | 0 |
|---|---|---|---|---|---|---|---|
| Opcode | | | Ext. | Data | | | |

Fig. 3
Prior Art

Basic Packet Formats

| Short Delta NC | | | | | | | |
|---|---|---|---|---|---|---|---|
| 7 | 6 | 5 | 4 | 3 | 2 | 1 | 0 |
| 00 | | Red | | Green | | Blue | |

| Short Delta CL | | | | | | | |
|---|---|---|---|---|---|---|---|
| 7 | 6 | 5 | 4 | 3 | 2 | 1 | 0 |
| 01 | | Red | | Green | | Blue | |

Fig. 9

| 7 | 6 | 5 | 4 | 3 | 2 | 1 | 0 |
|---|---|---|---|---|---|---|---|
| | | 1110 | | | Red[6:3] | | |
| Red[2:0] | | | Green[6:2] | | | | |
| Green[1:0] | | | | Blue[5:0] | | | |

Short Make Pixel

Fig. 10a

| 7 | 6 | 5 | 4 | 3 | 2 | 1 | 0 |
|---|---|---|---|---|---|---|---|
| | | 1110 | | | Red[3:0] | | |
| | Green[3:0] | | | | Blue[3:0] | | |

Short Make Pixel

Fig. 10b

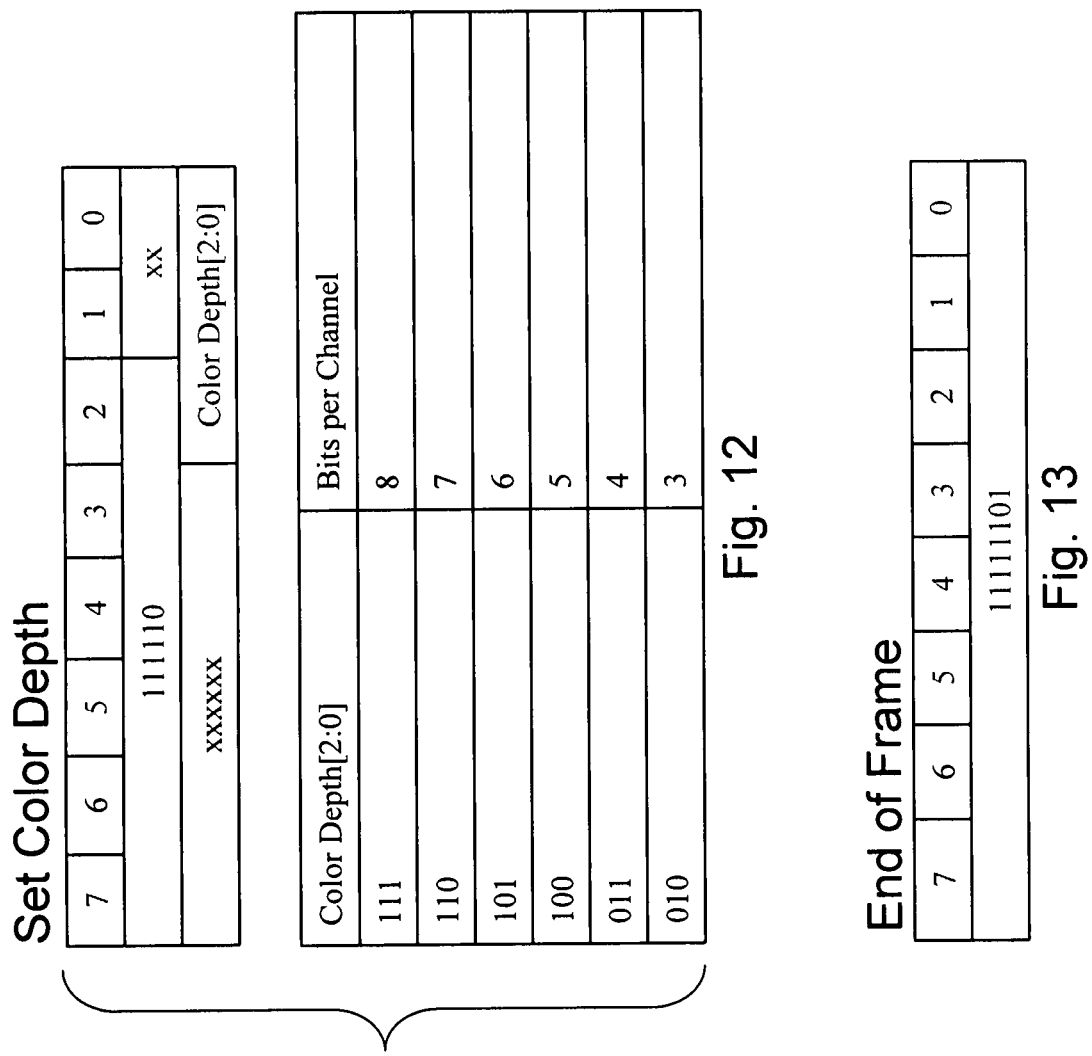

| Reserved | 6 | 5 | 4 | 3 | 2 | 1 | 0 |
|---|---|---|---|---|---|---|---|
| 7 | | | 11111110 | | | | |
| | | | 11111111 | | | | |

Fig. 14

Command Summary

| Mnemonic | Command | Encoding | Operands | Command Size in Bytes |
|---|---|---|---|---|
| SDNC | Short Delta NC | 00 | RGB[1:0] | 1 |
| SDCL | Short Delta CL | 01 | RGB[1:0] | 1 |
| NC | No Change | 1000 | Count[3:0] | 1 |
| CL | Copy Left | 1001 | Count[3:0] | 1 |
| CA | Copy Above | 1010 | Count[3:0] | 1 |
| DNC | Delta NC | 1011 | RGB[3:0] | 2 |
| DCL | Delta CL | 1100 | RGB[3:0] | 2 |
| DCA | Delta CA | 1101 | RGB[3:0] | 2 |
| SMP | Short Make Pixel | 1110 | RG[6:0], B[5:0] or RGB[3:0] | 3 or 2 |
| MS | Make Series | 11110 | Count[2:0] Pixel 0 or Pixel 1. | 2 |
| SC | Special Command (Set Color Depth). | 111110 | Color Depth[2:0] | 2 |
| MP | Make Pixel | 11111100 | RGB[7:0] | 4 |
| EOF | End of Frame | 11111101 | None | 1 |
|  | Command Reserved for Future Use. | 11111110 | Undefined | Undefined |
|  | Command Reserved for Future Use. | 11111111 | Undefined | Undefined |

Fig. 15

| Resolution | Refresh Rate | Horizontal Freq. | videoMode[7:0] Hex |
|---|---|---|---|
| No resolution | N/A | N/A | 00 |
| 640 x 350 | 85Hz | 37.9KHz | 04 |
| 720 x 400 | 85Hz | 37.9KHz | 08 |
| 640 x 480 | 60Hz<br>72Hz<br>75Hz<br>85Hz | 31.5KHz<br>37.9KHz<br>37.5KHz<br>43.3KHz | 0C<br>10<br>14<br>18 |
| 800 x 600 | 60Hz<br>72Hz<br>75Hz<br>85Hz | 37.9KHz<br>48.1KHz<br>60.0KHz<br>53.7KHz | 1C<br>20<br>24<br>28 |
| 1024 x 768 | 60Hz<br>72Hz<br>75Hz<br>85Hz | 48.4KHz<br>56.5KHz<br>60.0KHz<br>68.7KHz | 2C<br>30<br>34<br>38 |
| 1152 x 864 | 75Hz | 67.5KHz | 3C |
| 1280 x 768 | 60Hz | 60.0KHz | 40 |
| 1280 x 1024 | 60Hz | 64.0KHz | 44 |

Fig. 17

VIDEO COMPRESSION ALGORITHM

RELATED PATENTS AND APPLICATIONS

The present application claims priority to U.S. Provisional Application Ser. No. 60/774,186, filed Feb. 17, 2006, U.S. Provisional Application Ser. No. 60/836,649, filed Aug. 10, 2006, Ser. No. 60/836,930, filed Aug. 11, 2006, and Ser. No. 60/848,488, filed Sep. 29, 2006 the entire contents of which are incorporated herein by reference.

The present application is also related to the following co-pending U.S. Patent Applications that are herein incorporated by reference in their entirety:

1. U.S. application Ser. No. 11/707,863, entitled "Device and Method for Configuring a Target Device," filed Feb. 20, 2007.
2. U.S. application Ser. No. 11/707,880, entitled "Power Cycling," filed Feb. 20, 2007.

The present application is also related to U.S. application Ser. No. 10/260,534 entitled "Video Compression System" filed on Oct. 1, 2002 and U.S. application Ser. No. 11/790,994, entitled "DVC Deltas Delta Commands" filed Apr. 30, 2007. The contents of each of the above identified applications are also incorporated herein by reference in their entirety.

FIELD OF THE INVENTION

This relates to video compression.

INTRODUCTION

A video compression system and algorithm are disclosed herein that use a compression scheme based on the directional algorithm concepts previously disclosed in application Ser. No. 10/260,534 ("DVC encoding") and the delta encoding concepts previously disclosed in application Ser. No. 11/790,994 with some newly added enhancements to compress frames of video. Its specific application here is to reduce the bandwidth used in transmitting a video frame across a LAN, for example an Ethernet LAN. The so-called "DVC encoding," and "DVC delta encoding" are employed herein with some modifications including newly added extensions as described below. The contents of U.S. application Ser. No. 10/260,534 and U.S. application Ser. No. 11/790,994 are assumed to be known to the reader. Products employing the "DVC encoding" described in U.S. application Ser. No. 10/260,534 have been commercialized and should be considered prior art.

In the "DVC encoding" and the "DVC delta encoding" algorithms each side of the link has a version of the previous frame to use as a reference. This allows each pixel in subsequent frames to be defined in one of the following several ways:

1. No change from pixel in previous frame (NO_CHANGE)
2. Same as pixel immediately above (COPY_ABOVE)
3. Same as pixel to the immediately left (COPY_LEFT)
4. Series of pixels from a preceding known subset (MAKE_SERIES)
5. Make new pixel (NEW_PIXEL or MAKE_PIXEL)
6. Delta from pixel in the previous frame (DELTA_NC)
7. Delta from pixel immediately above (DELTA_CA)
8. Delta from pixel immediately left (DELTA_CL)

Only the make pixel option requires that a complete RGB bit-encoded pixel be sent across the link. The first three commands listed above ("directional commands") require that only a short command message be sent indicating which type of encoding is used and how many consecutive pixels are encoded according to that encoding type. During encoding, the pixel data for a current pixel to be compressed is compared to reference pixel values read from memory. A full frame of pixel data is kept for doing a NO-CHANGE comparison, a full line of pixel data is kept for doing a COPY_ABOVE comparison, and a single copy of the previous pixel is kept for doing the COPY_LEFT comparison. For each of the three directional commands, if the command is active and the associated comparison matches, then the command remains active and the prospective set increases by one more pixel. When all directional commands have terminated, due to either failure, inapplicability, or end conditions, then the last active command is chosen as the encoding for that set of pixels.

In the event of a tie between command types, then priority can be assigned in the following example order: NO_CHANGE, COPY_LEFT, COPY_ABOVE. Under some circumstances, this is the order that provides the greatest ease of decoding. However, other orders can be used. With double or triple buffering on each end, all three commands require similar effort by the decoder and thus alternative priorities are equally viable.

The MAKE_SERIES encoding type takes advantage of a sequence of pixels all being from a subset of immediately preceding unique pixel colors. The standard mode is to use a two-color subset, which is ideal for text windows. In standard mode, there is a single data bit for each pixel represented that specifies whether that pixel is the first or the second of two different colors. The two colors are defined automatically as the two most recent and different colors seen. A subset register stores the pixel color of each preceding unique pixel color. A current pixel is then compared against each of the pixels. in the current series subset registers. All of the comparisons are done in parallel, with the Boolean result sent to a command process. As long as any one (and it should be no more than one) of the subset comparators is true, then the series command is valid and continues.

Because NEW_PIXEL is the least efficient compression method, it is least favored and used only when the other compression types do not apply to a current pixel. Thus, a NEW_PIXEL determination always terminates a pixel encoding stream and sends the preceding command string for transmission and decoding. Then, NEW_PIXEL commands are accomplished on a pixel-by-pixel basis until another encoding type will again apply to a current pixel.

These first five command types listed above are, in general, referred to as the DVC-based commands which are described in greater detail in U.S. application Ser. No. 10/260,534.

Delta commands are another alternative to sending the full precision color. Delta commands send a much smaller value which is the difference (delta) between the real color and one of the neighboring colors used as a reference. The delta commands attempt to limit the number of bits transmitted when the directional commands fail or are no longer applicable and a pixel has to be sent. The delta commands are based on the assumption that the pixel to be encoded may be close in color to one of its neighbors. For example, in the case of 24-bit color, the delta can be either 4 bits or 12 bits. There are several different types of delta commands that could be implemented. Some types of delta commands include a unique delta value for each color channel, while others contain a uniform delta that is applied to all color channels. The size (in terms of bits) of each delta can also vary according to the configuration. Delta commands typically use the same reference pixels as the directional commands.

The last three command types listed above are, in general, referred to as the DVC-Delta commands which are described in greater detail in application Ser. No. 11/790,994.

FIG. 1 and FIG. 2 show a typical implementation of the prior art DVC based commands and the DVC delta commands for 8-bit packets. FIG. 3 shows the basic packet structure for a typical implementation of the prior art DVC based commands. As shown in FIG. 3, the basic packet structure includes: (1) a 3-bit opcode portion that distinguishes the eight types of commands (e.g. "000" for NO_CHANGE, "001" for COPY_LEFT, etc.), (2) a 1-bit extension portion that determines if additional packets are required to execute a type of command, and (3) a payload portion (e.g. "Count (3:0)"). FIG. 1 shows first and subsequent packet structures for some of the DVC command types. The NO_CHANGE, COPY_LEFT, and COPY_ABOVE have a first packet like the one shown in FIG. 3 followed by a subsequent packet, if necessary, to extend the count length. The MAKE_SERIES command has a first packet like the one shown in FIG. 3 followed by a subsequent packet, if necessary, to extend the count length.

The NEW_PIXEL command is shown in FIG. 1 as well. Prior art DVC based command implementations support three different color modes. Color mode determines how many bits will be used in the NEW_PIXEL command and thus how many subsequent 8-bit packets will follow the header packet of a NEW_PIXEL command. The color modes are: 24-bit (3 subsequent packets), 15-bit (2 subsequent packets), and 7 bit (1 subsequent packet). The color mode can be set by a user explicitly or implicitly by setting a bandwidth threshold. When a bandwidth threshold is set the color mode changes dynamically to meet the defined bandwidth constraint. Regardless of the color mode the video compression system receives and stores 24-bit pixel values from the digital video source. When the color mode is set to less than 24-bits, the video compression system masks extraneous least significant bits before the pixel values are processed for encoding. Further, when the color mode is set to less than 24-bits, the decoder creates a 24-bit pixel value by copying the respective 3 most significant bits to the truncated bits. The decoder must be aware of the color mode so that the decoder can properly construct pixel values from a NEW_PIXEL payload. When the color mode is set to less than 24-bits color information is lost. That is, the decoder does not recover the actual values of the truncated least significant bits, because the bits are discarded before being encoded. Color mode is described in greater detail in application Ser. No. 11/790,994.

FIG. 2 shows the packet formats for the delta command packets. The DELTA_NC, DELTA_CL, and DELTA_CA have a first packet like the one shown in FIG. 3 followed by a subsequent packet, if necessary, to extend the delta value.

In addition to color mode, application Ser. No. 11/790,994 discloses changing comparison depth. Comparison depth specifies how many bits of two pixel value are compared to each other. Changing comparison depth involves masking the least significant bits of a current pixel and a reference pixel to increase the likelihood that the pixels appear to be equal. In application Ser. No. 11/790,994 the user can set the comparison depth explicitly by specifying the comparison depth per channel or implicitly by setting a bandwidth threshold. When a bandwidth threshold is set the comparison depth changes dynamically to meet the defined bandwidth constraint. When comparison depth is reduced, pixels copied using a reduced comparison depth may have a slightly different color than their actual color value. Further, when comparison depth is reduced, the NEW_PIXEL command still requires all the bits of a pixel value to be sent.

FIG. 4 is a simplified prior art logical diagram illustrating how the prior art commands are logically executed. As shown in FIG. 4, for each comparison the current pixel color data and a respective reference pixel color data are input into a comparison block. The current pixel refers to the presently received pixel that is to be encoded. The reference pixel refers one of the pixels defined by an encoding command (e.g. the pixel to the left, the pixel above, etc.). A comparison/delta block outputs variables that tell the command process whether the pixel color values are equal (i.e. all 24-bits are the same) or whether the pixel color values are different within a predetermined delta. There are comparison/delta blocks for each location relationship (e.g. immediately left, immediately above, and same pixel previous frame). For the make series command there is a comparison block for the number of pixels defined in a series. Further, a 24-bit rMask is also input into a comparison block. The rMask is set based on the color mode and comparison depth. The rMask masks the least significant bits of a current pixel value and a reference pixel value as determined by the color mode and comparison depth. The corresponding masked bits of the current pixel value and the reference pixel value are determined to be equal by a comparison block. Comparison blocks are described in greater detail in application Ser. No. 11/790,994.

The video compression unit described herein adds the following additional commands to the eight commands described above:

9. Short Delta from the same pixel in the previous frame (Short_Delta NC)
10. Short Delta from the pixel immediately to the left (Short_Delta_CL)
11. Make Pixel using fewer bits (Short_Make_Pixel)

The video compression unit described herein is able to add the new commands within an eight-bit packet structure by using a variable length opcode portion and by eliminating the extension bit.

The video compression engine described herein also allows the user to set the comparison depth as a function of video frames. This is referred to as reference-intermediate mode. Reference-intermediate mode includes two types of frames, a reference frame. (R-frame) and an intermediate frame (I-frame). An R-frame is a frame with a relatively high comparison depth (e.g. 24-bits of comparison depth). An I-frame is a frame with a comparison depth less than the R-frame (e.g. an I-frame has a comparison depth of 12 bits). The user sets the comparison depth for each type of frame and a ratio of R to I frames (e.g. 1 R-frame for every 3 I-frames). Once these values are set, the encoder will automatically vary the rMask accordingly.

The video compression engine described herein also adds a compression-rate limit function. When the compression rate falls below a certain level the video compression engine can do any combination of the following: (1) drop frames, (2) change color depth, and (3) adjust the comparison depth. Frame dropping decreases video latency by allowing a larger range of frames to be processed by the system in a given amount of time. A color depth drop and/or a comparison depth adjustment helps increase the compression rate until the compression rate returns to a minimum target level. Increasing the compression ratio reduces video latency by reducing the average number of bits needed to represent a frame, thereby allowing more frames to be transmitted across the system at given data rate (e.g. Mb/s). Hysteresis is used with the compression-rate limit function to minimize impacts to a user that would occur from rapidly switching compression parameters, as would be the case when the compression rate fluctuated about the minimum target level.

BRIEF DESCRIPTION OF THE DRAWINGS

The following description, given with respect to the attached drawings, may be better understood with reference to the non-limiting examples set forth with the drawings which are as follows:

FIG. 2: prior art DVC delta based commands;
FIG. 3: prior art basic header format for DVC and DVC delta based commands;
FIG. 9: exemplary short delta commands;
FIG. 10a: exemplary short make pixel command;
FIG. 10b: exemplary short make pixel command;
FIG. 12: exemplary color depth command and exemplary color depth modes;
FIG. 13: exemplary end of frame command;
FIG. 14: reserved commands;
FIG. 15: an exemplary command summary table;
FIG. 17: table of exemplary video modes.

DETAILED DESCRIPTION OF THE PRESENTLY PREFERRED EXEMPLARY EMBODIMENTS

The exemplary embodiment of the video compression algorithm described herein is a 24-bit color video compression protocol. The video packets of the compression protocol are based on 8-bit cells.

Figure 1:
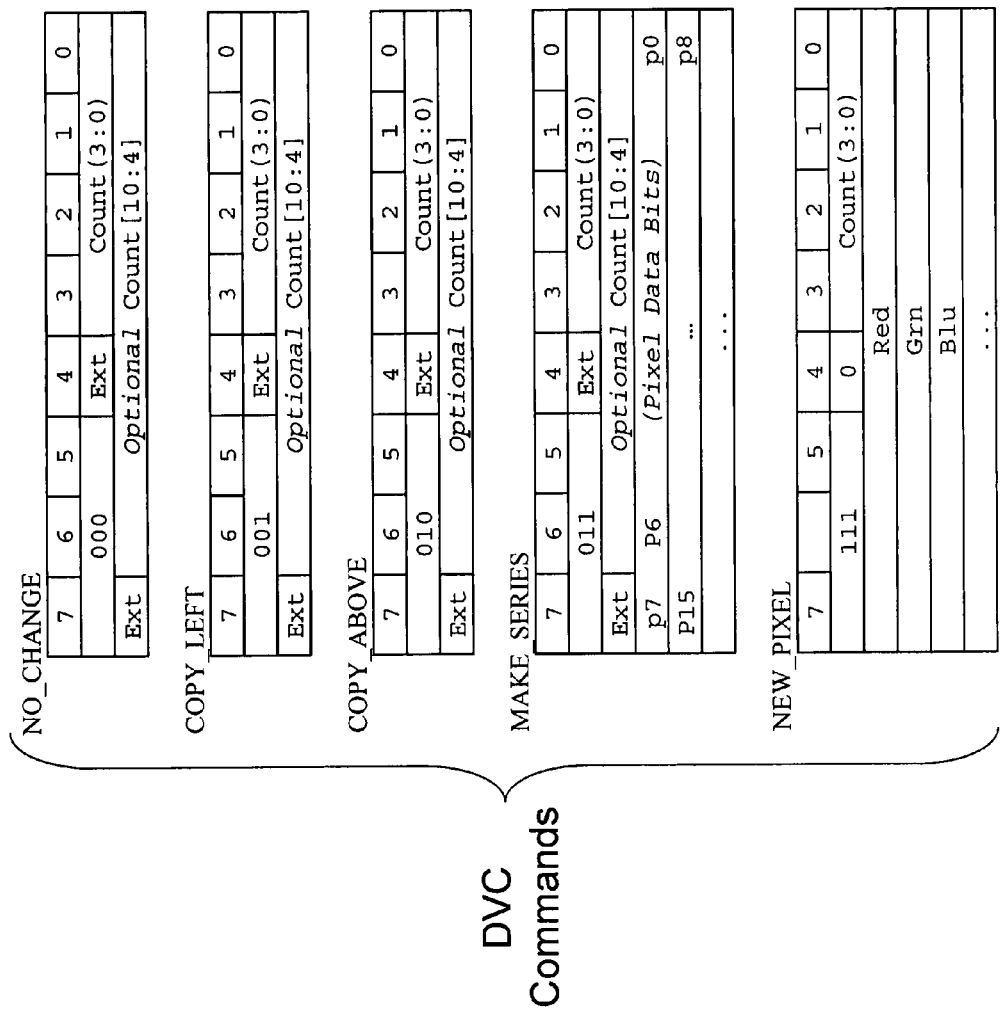
FIG. 1: prior art DVC based commands.
Figure 4:
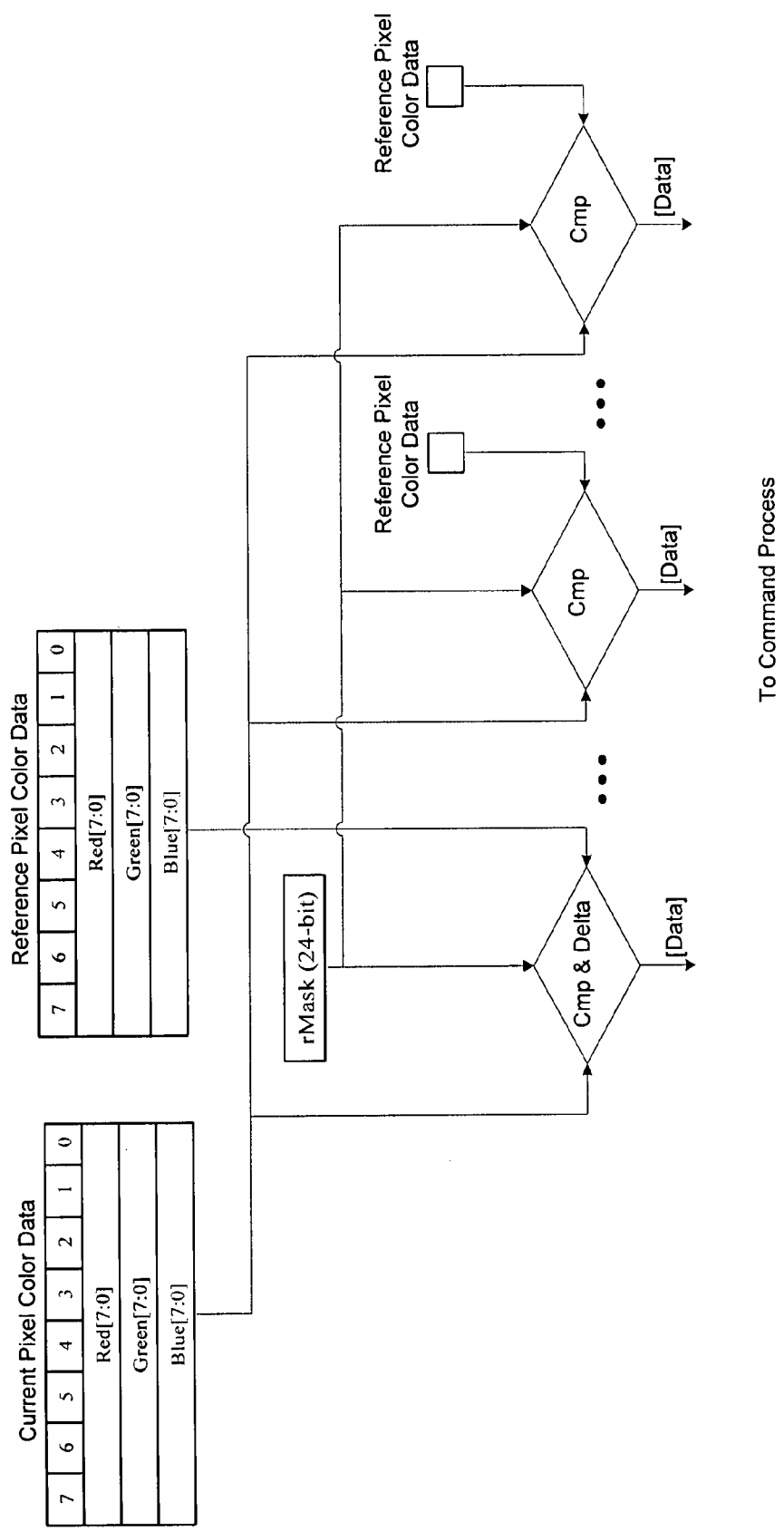
FIG. 4: prior art simplified logical diagram implementing prior art DVC and DVC Delta based commands.
Figure 5:
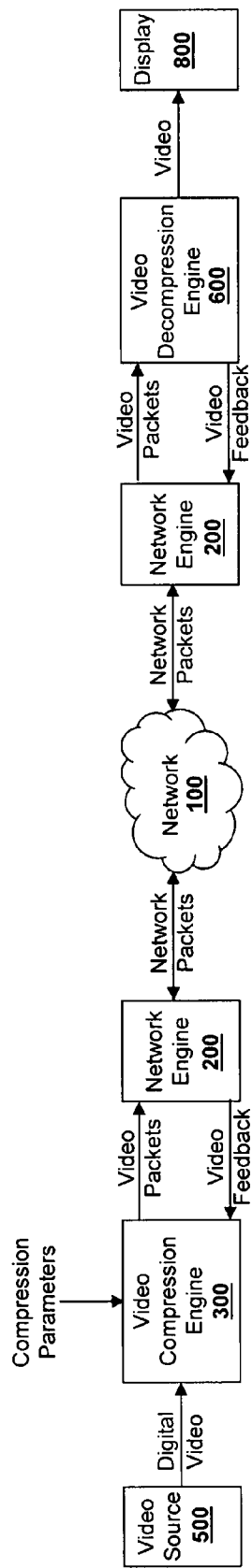
FIG. 5: an exemplary video compression system.

FIG. 5 shows an exemplary video compression system. Video compression engine 300 and video decompression engine 600 communicate across network 100. Network 100 is typically an ethernet network, but can be any type of known communications network. Network engine 200 translates communications between video compression engine 200 and video decompression engine 300 into a format that is compatible with network 100.

Video compression engine 300 performs the encoding algorithm described herein. Video compression engine 300 is configured with specified compression parameters that are described in greater detail in accordance with the compression algorithm. Video compression engine 300 receives digital video from video source 500 and outputs video packets to network engine 200. Video source 500 is a device that outputs digital video by either generating digital video natively or by converting analog video from another device into digital video. In the exemplary embodiment, digital video represents each pixel with a 24-bit RGB value. In alternative embodiments pixels can be represented using another color space and/or a different number of bits.

Video decompression engine 600, receives the video packets generated by video compression engine 300 and outputs analog or digital video for display 800 by decoding the received packets. Video decompression engine 600 also monitors the compression rate and transmits the compression rate to video compression engine 300.

Figure 6:
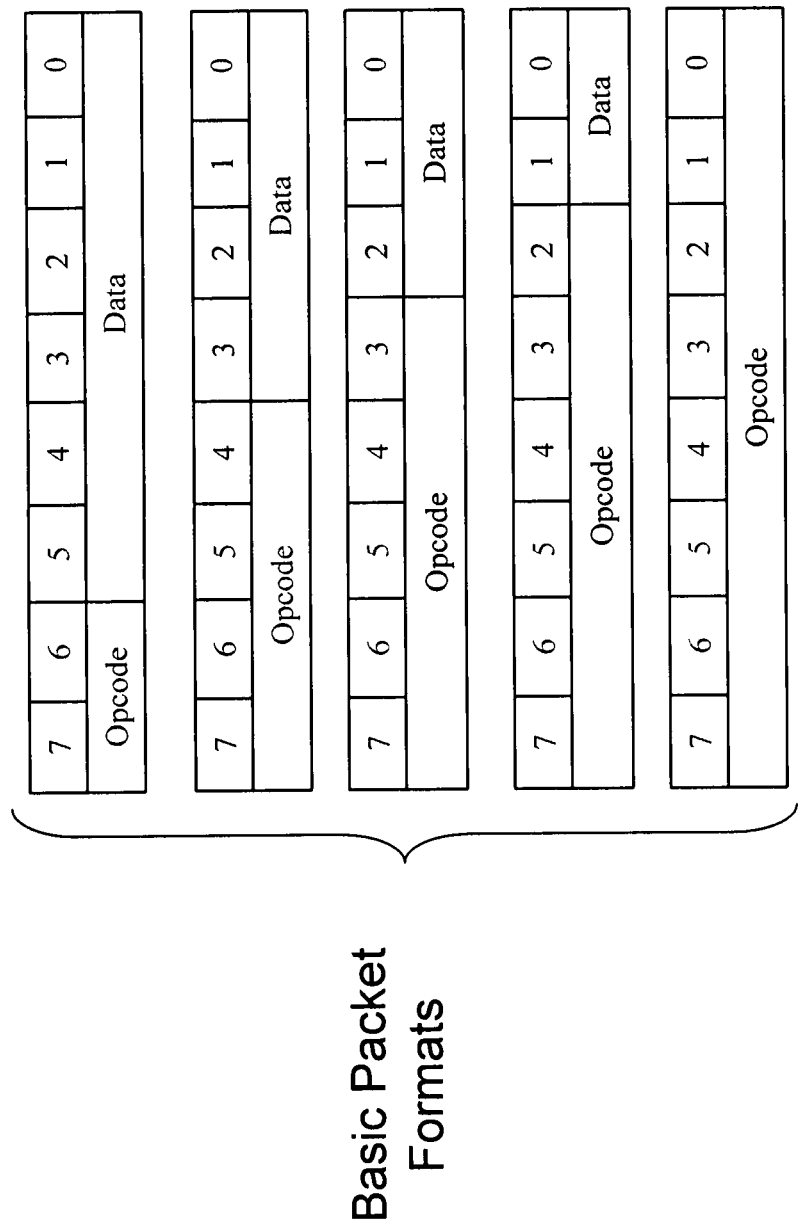
FIG. 6: exemplary packet formats with variable length opcode.

There are several types of header packets defined. The format of the header packet depends on the command encoded. For example, short delta commands have a 2-bit opcode in the header packet, whereas other delta and copy commands have a 4-bit opcode. FIG. 6 shows the basic packet formats of the header packets used in the exemplary embodiment.

As shown in FIG. 6, none of the header packets have an extension bit. When commands are received back-to-back and the opcodes are identical, the first command denotes the least significant bits of the count and the second command or third command denote the most significant bits of the count. Thus, the extension bit is unnecessary. In the exemplary embodiment, up to 3 identical copy commands can be received consecutively yielding a maximum run length of 4096. The command structure and corresponding packet formats are described in greater detail in FIGS. 7-10b.

Figure 7:
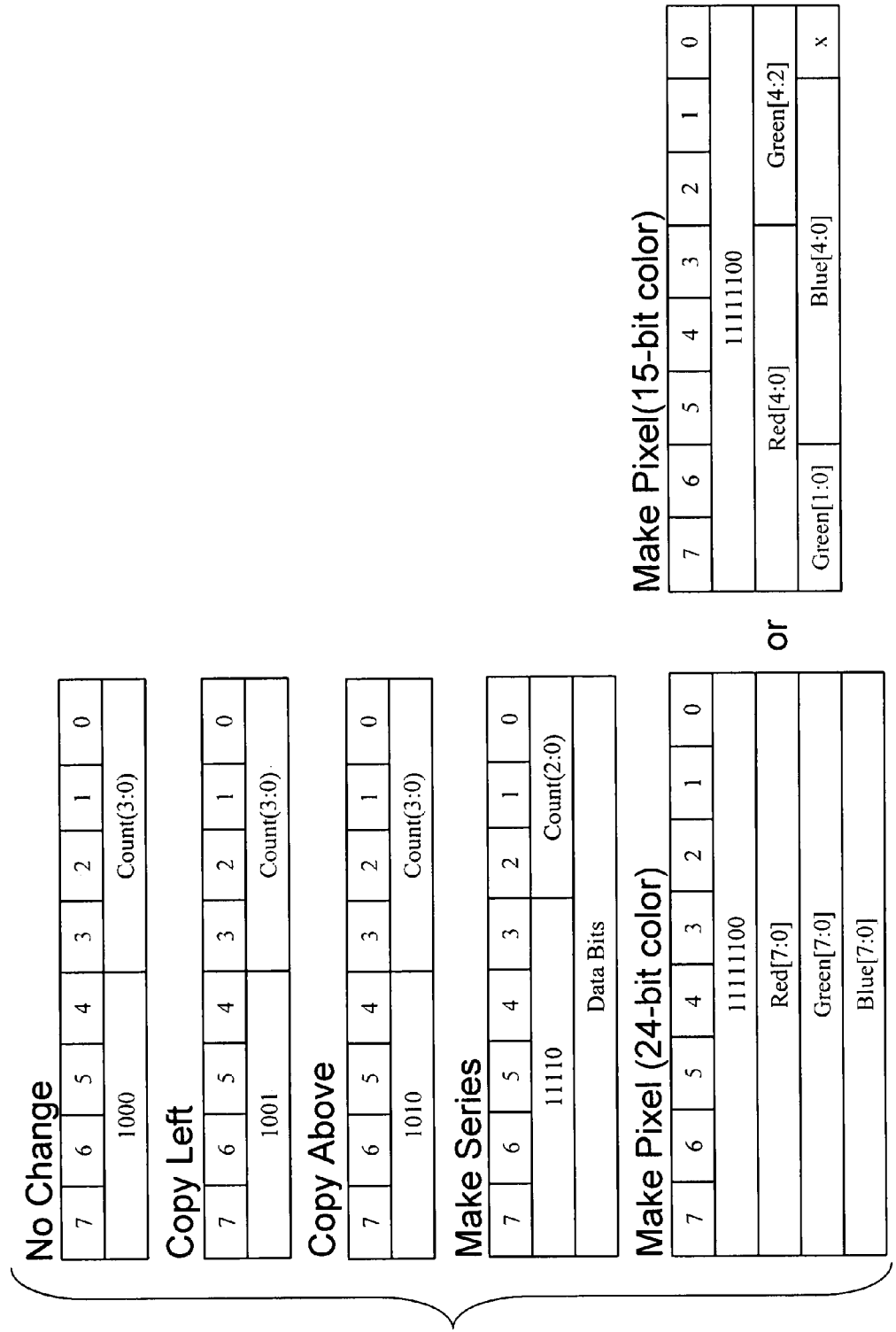
FIG. 7: DVC commands implemented in an exemplary basic packet format.

FIG. 7 shows the previously described DVC-based encoding commands implemented using the exemplary basic packet formats of the present video compression algorithm. As shown, the packets for the copy commands have a 4-bit opcode and a 4-bit payload.

As shown in FIG. 7, the header packet for the make series command has a 5-bit opcode and a 3-bit payload. In addition to the header packet, the make series command includes a subsequent data packet. The make series command in the present exemplary embodiment represents a series of pixels of length count that are one of two possible colors. The first packets in a make series command have a maximum count length of 8. The most significant data bit denotes the first pixel encoded. Alternative embodiments can support a concatenated.

FIG. 7 shows two alternative exemplary make pixel commands. As shown in FIG. 7, one make pixel command has a header packet with an 8-bit opcode and has three subsequent packets specifying the full 8-bits of the colors red, green and blue generated by the video source. This make pixel is used when the color depth is set to 24-bits. FIG. 7 also shows an exemplary make pixel command where the color depth is set to 15-bits. As shown, in the 15-bit embodiment there are 5-bits specifying red, green, and blue and two subsequent packets following the header packet. It should be noted that the make pixel command can be use to accommodate any number color depth modes and that number of subsequent packets following the header packet will be adjusted accordingly.

Figure 8:
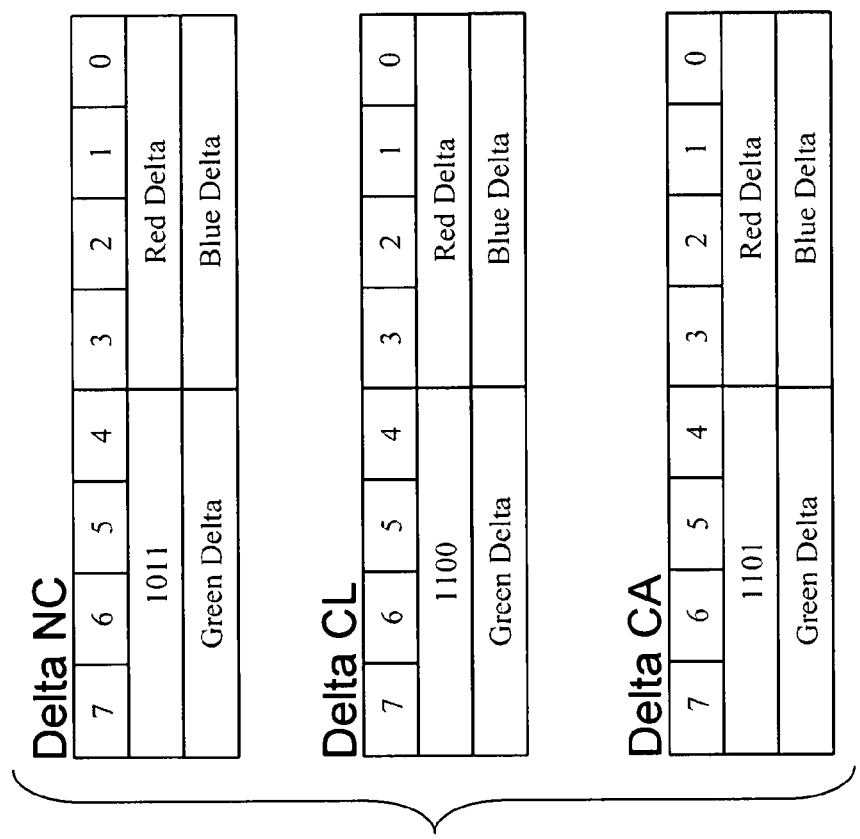
FIG. 8: DVC deltas implemented in an exemplary basic packet format.

FIG. 8 shows the DVC delta based encoding commands implemented using exemplary basic packet formats. The deltas chosen below are the original signed 4-bit values supporting a range [−8,+7] described in Ser. No. 11/790,994. As shown in FIG. 8, the original delta commands have a header packet with a 4-bit opcode and a 4-bit payload. The original delta commands also include a subsequent data packet.

FIG. 9 shows the short delta commands. The short delta commands have a 2-bit opcode and a 6-bit payload. Thus, by providing a simple reference to the neighbor (via the command field) and a signed color delta, a short delta command may reduce the data to as little as 25% of what would otherwise have been required if a large make pixel command were to be sent. Short delta commands with a two bit-opcode are unique to the present video compression algorithm. Signed 2-bit values supporting a range [−2,+1] which are described for the first time herein. By using a 2-bit opcode, a delta command can be represented by a single packet, when 2-bits are used to represent the delta for each color channel. Short Delta NC specifies short deltas for the same pixel in the previous frame. Short Delta CL specifies short deltas for the immediate left pixel. It should be appreciated that although the exemplary embodiment describes short deltas that use a reference pixel in the same location of the previous frame as the current pixel and a pixel immediately to the left of the current pixel, any combination of the three frame location relationship described in accordance with the DVC Delta commands can be used (i.e. left, above, and previous frame). Further, any other combinations of frame location relationship types can be employed for the short delta commands.

FIGS. 10a and 10b show short make pixel commands which are unique to the present video compression algorithm. Short make pixel is a truncated version of the make pixel command. That is, some number of least significant bits are removed from the R, G, and B payloads. If, for example, a red value is seven bits (0111010, for example), then some number of least significant bits (for example three) are truncated (leaving in this example, a red value of 0111XXX). Short make pixel allows a reduced version of a pixel to be transmitted to the video decompression unit 600 using less packets than the make pixel command. In this example, a short make pixel command provides a data-reduced (and thus an information lossy) version of a pixel color value for one frame only—whereupon the lost information is again recovered in the next subsequent frame, as described in greater detail below. When a short make pixel command is received at video decompression unit 600, video decompression unit 600 fills in the missing least significant bits with arbitrary values (in this example, the unit 600 may always fill red with "111" making the decoded red value: 0111111). Short make pixel is unique from previously described reduced color mode make pixel command (e.g. 15-bit make pixel), because short make pixel can coexist with make pixel commands. That is, color mode does not need to be changed for the video decompression unit to properly interpret a short make pixel command. Further, a short make pixel command can be generated after the full color data of the current pixel and a reference pixel have been compared.

Short make pixel is particularly useful with delta commands. In the case where the pixel value remains the same for the subsequent frame after the short make pixel command is used, the complete pixel value can be retrieved using a delta command. That is, if the video compression engine 300 knows the arbitrary values that the decoder will be using to fill in the missing least significant bits, then on the next frame, the encoder can identify a change/delta value from the value with the arbitrary LSBs rather than the true LSBs, thereby recovering the lost information at the video decompression engine 300 within one frame. When the video compression engine 300 creates a short make pixel command, the modified pixel data is written away to the video memory, before the next set of comparisons. Thus, pixel data that is lost for one frame can be retrieved in the subsequent frame. In most cases, depending on the frame rate and how many color bits are truncated, the user probably will not be able to perceive that a short make pixel command is somewhat lossy.

The short make pixel in FIG. 10a uses 3 packets instead of 4 packets like the make pixel command. The short make pixel in FIG. 10a has a header packet with a 4-bit opcode and includes two subsequent data packets. The eye gives priority to the primary colors in the following order: first green, then red, then blue. Thus, the short make pixel in FIG. 10a specifies the 7 most significant bits of the colors red and green and specifies the 6 most significant bits of blue. For the short make pixel of 10a, the video decompression engine 600 can represent the truncated bits by using arbitrary, pre-assigned values, or by copying values from the most significant bits for red, green, and blue. The decompression engine 600 is configured so that the one truncated bit from the red and green color channel and two truncated bits of blue color channel can be reconstructed using a two-bit short delta. Thus, the full pixel value, if it remains the same and if necessary, can be represented in the subsequent frame using a short delta NC command.

The short make pixel in FIG. 10b uses 2 packets instead of 4. The short make pixel in FIG. 10b has a header packet with a 4-bit opcode and includes one subsequent data packet. Thus, the short make pixel in FIG. 10b specifies the 4 most significant bits of the colors red, green, and blue. For the short make pixel of 10b, the video decompression engine 600 can represent the truncated bits by copying the values of the most significant bits for red, green, and blue. The decompression engine 600 is configured so that the four truncated bits from the red, green, and blue color channels can be reconstructed using a four-bit delta. Thus, the full pixel value, if it remains the same and if necessary, can be represented in the subsequent frame using a delta NC command.

Figure 11:
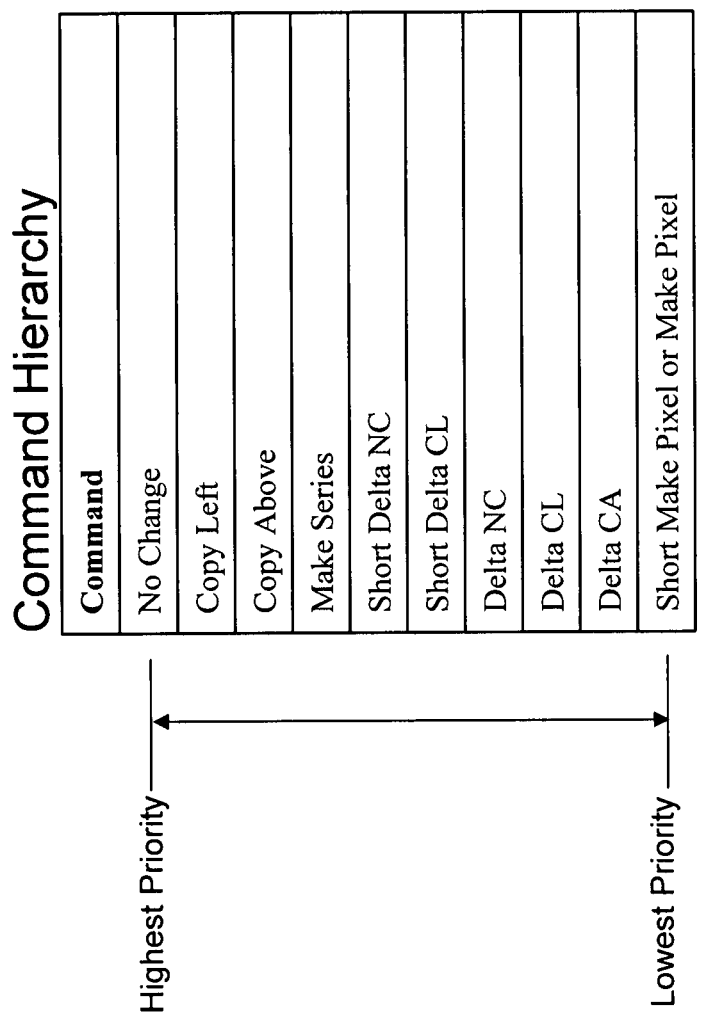
FIG. 11: a table showing exemplary command hierarchy.

A current pixel is processed as it is received to see if it can be encoded in one of the compressed message types. The goal is to choose the compression type that can be applied to the longest string of consecutive pixels. Pixel processing continues, therefore, with types being continuously ruled out until either none remain or the end of a line is reached. A consecutive string can stop in any of the following circumstances: the type chosen is the last type to have failed, the maximum run length has been reached, or multiple commands failed at once. FIG. 11 shows how priority is assigned when multiple commands fail at once.

FIG. 12 shows the color depth command. The color depth is a special command that informs the video decompression engine 600 of a change in color depth. As shown in FIG. 12, the three bit color depth[2:0] value is encoded to specify how many bits will make up each color channel. The video decompression engine 600 knows the color depth setting so it knows how make pixel commands are interpreted. With this code, for example, color depth can be rapidly changed to balance color fidelity with the bandwidth characteristics of the transmission medium. In one embodiment, a compression rate is calculated (actual number of sent packets compared to the number of packets required to send 24-bit color pixel-by-pixel) and if the compression rate falls below a certain level, the color depth is reduced using the set color depth command. Reducing color depth reduces the number of bits that need to be sent across the transmission medium for a make pixel command. Color depth can be designated to reach a threshold throughput compression rate.

FIG. 13 shows the end of frame command. This command can be used to tell the video decompression engine 600 that video compression engine 300 has finished encoding a video frame. It should be noted that an end of frame command need not be sent to the video decompression engine 600, as video decompression engine 600 may kept track of the end of a frame independent of video compression engine 300 after a video mode is specified.

Figure 14:
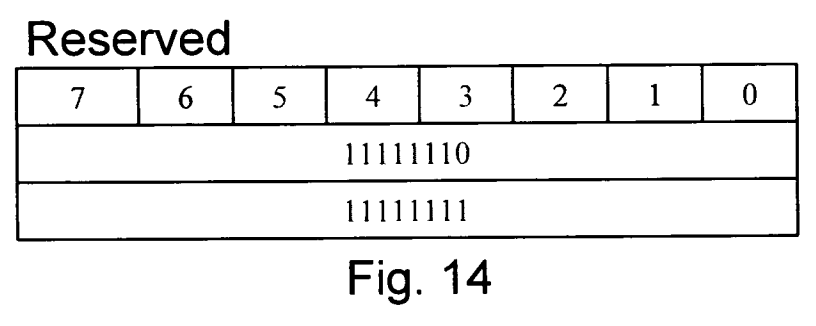

FIG. 14 shows the header packets with opcodes that are currently reserved in the present exemplary embodiment. These header packets can be used for additional encoding commands in alternative embodiments. For example, these header packets can be used to distinguish make pixel commands for different color depths.

FIG. 15 is a table summarizing all the commands described above. Each command is shown with its associated opcode, operand, and command size.

Figure 16:
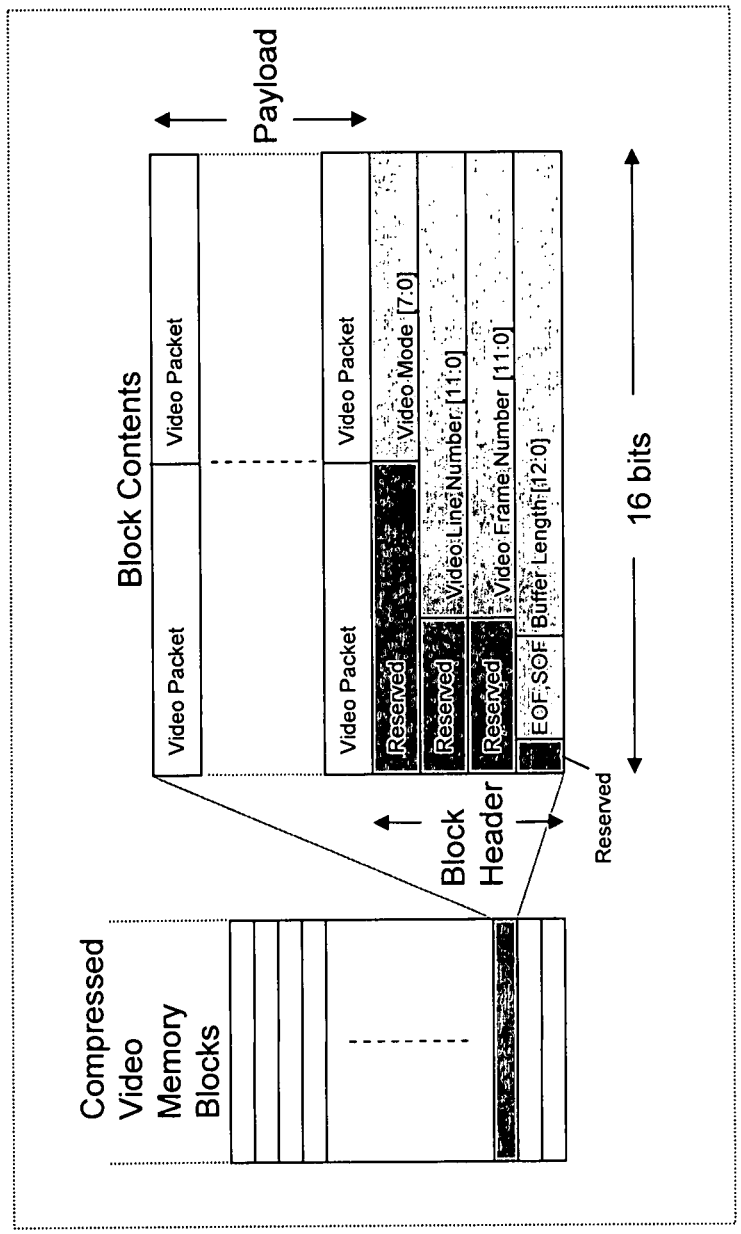
FIG. 16: exemplary video memory blocks.

FIG. 16 shows video packets generated by video compression engine 300 encapsulated within compressed video memory blocks for transmission across network 100 to video decompression engine 600. Video memory blocks are typically a fixed sized. As shown, a compressed video memory block comprises two portions: a payload and a block header. The payload comprises a combination of video packets previously described and summarized in FIG. 15.

The block header specifies the video mode, line number, frame number, and whether it is an end of frame or start of frame. The video decompression engine 300 uses this information on a block-by-block basis as it decodes. The videoMode[7:0] bus is 8 bits wide allowing for up to 256 different resolutions. Exemplary video modes are shown with respective codes in FIG. 17. Frame number and line number specify the start of video information encoded within a video block. Exemplary video frame number is 12 bits to enable packet snooping for debugging. The width of this bus can be reduced.

The system can monitor the video latency across the system and adjust the compression parameters of the video compression engine 300 to maintain an acceptable latency. Video latency affects the user at the decoder end. For example, too much video latency can adversely affect the user's mouse performance. Frame number and line number are used to monitor the video latency across the system. After video latency is measured, video latency can be adjusted by adjusting the compression parameters.

Video decompression engine 600 generates an explicit acknowledgement for each memory block received. The acknowledgement contains the current frame number and line number received by the video decompression engine 600 for processing. The acknowledgement is sent across network 100 to video compression engine 300. Video compression engine 300 uses the acknowledgment to understand how many lines the video decompression engine 600 is behind, this is a measure of the latency of the video between the video compression engine 300 and the video decompression engine 600, and is a measure of the latency caused by each ends' network engine 200. Video compression engine 300 monitors the frame number and line number within the frame being processed by the video decompression engine 600 with respect to the current frame number and line number it is currently processing. If the number of lines between the frame number and line number at the video compression engine 300 and the frame number and line number at the video decompression engine 600 exceeds a configurable watermark, compression parameters are changes to effectively allow a larger span of video frames to be processed by the video decompression engine 600. It should be noted that exemplary video decompression engine 600 is typically passive and processes all video data sent to it. Thus, video decompression engine 600 typically does not have an independent mechanism for reducing video latency.

Figure 18A:
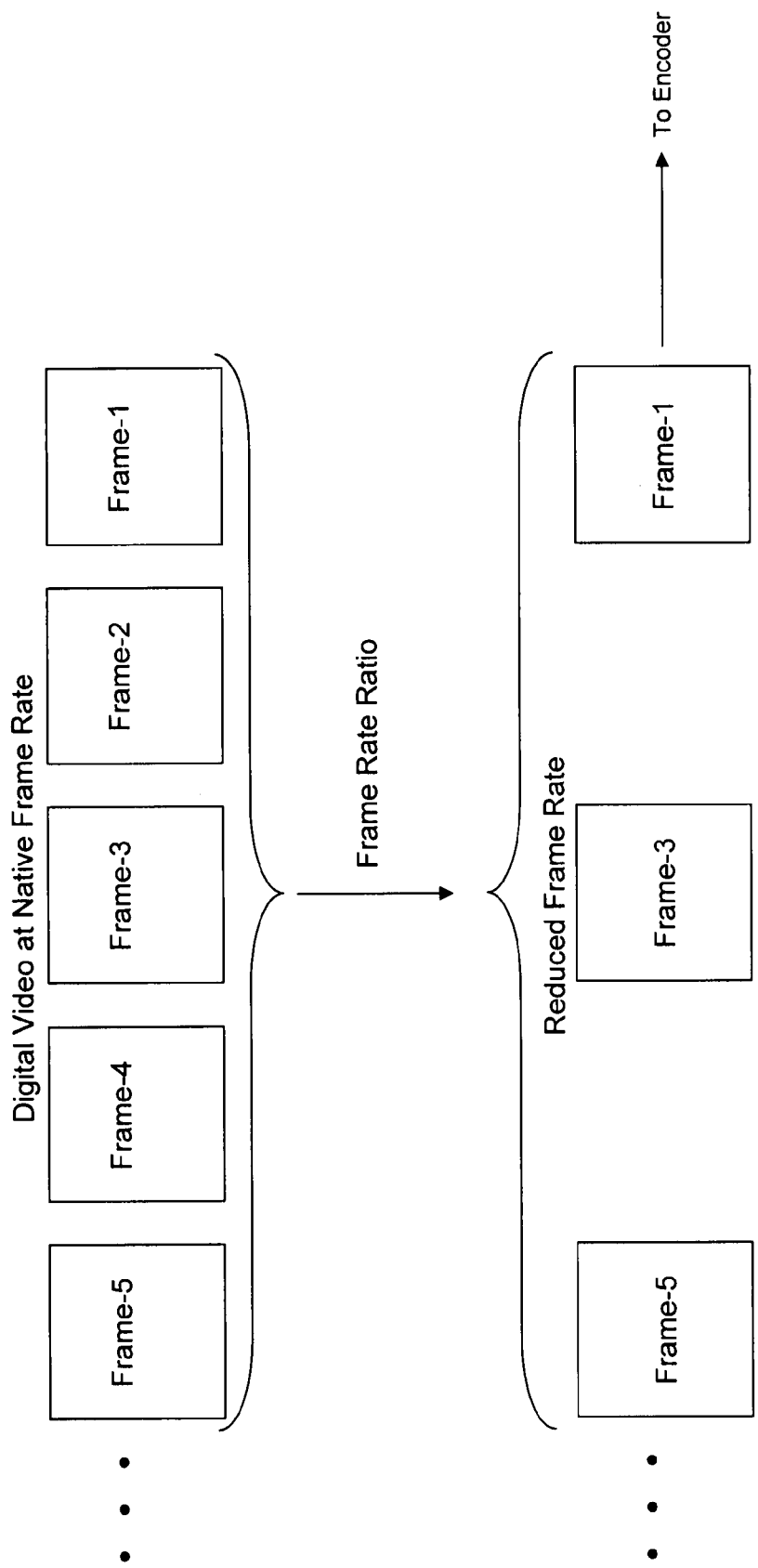
FIG. 18a: diagram illustrating frame dropping.
Figure 18B:
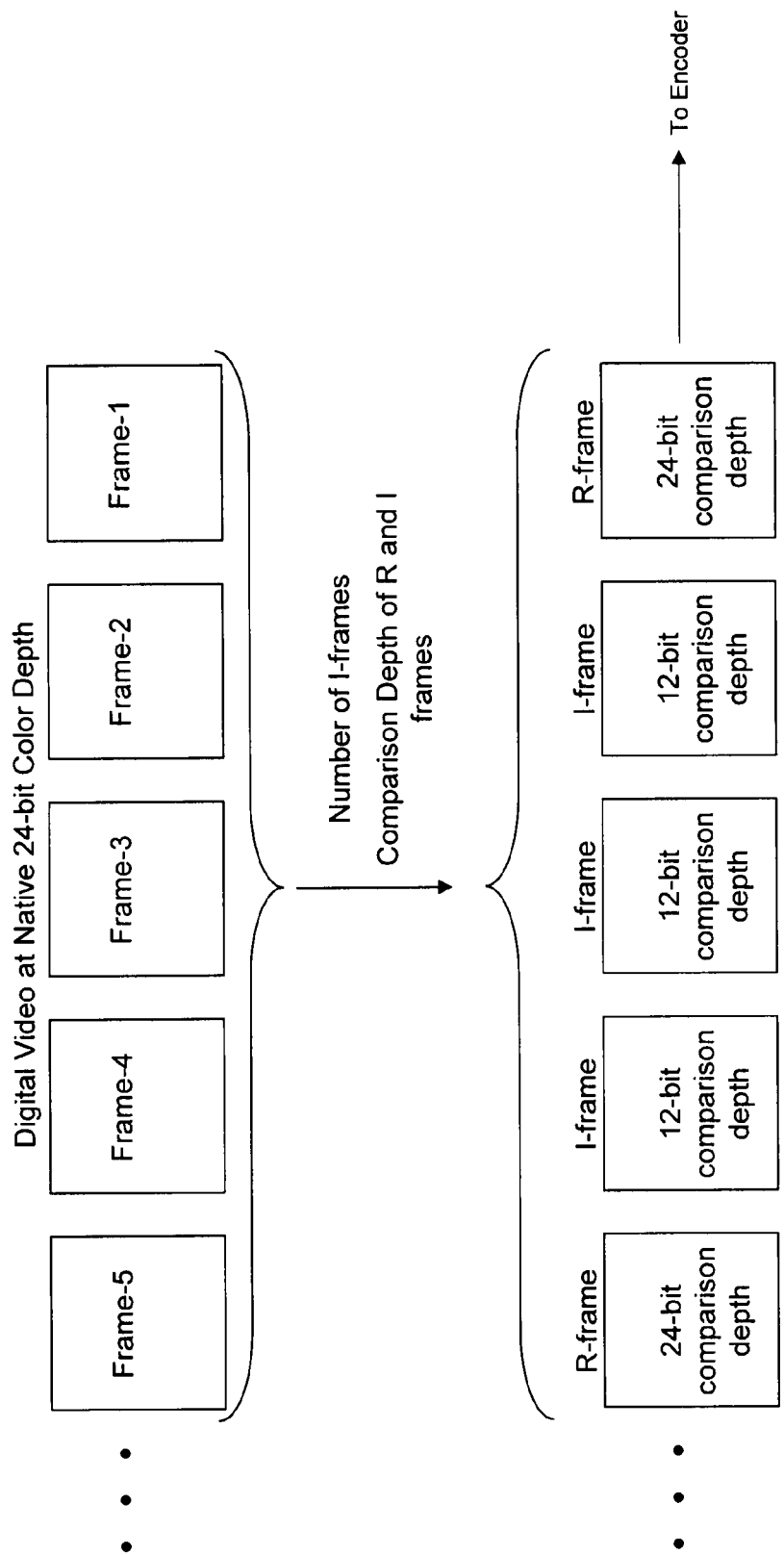
FIG. 18b: diagram illustrating reference-intermediate comparison depth.

FIGS. 18a and 18b illustrate two ways in which video compression engine 300 allows a larger span of frames to be processed by video decompression engine 600 in a shorter period of time.

FIG. 18a illustrates frame dropping by the video compression engine 300. As shown in FIG. 18a, incoming digital video has a native frame rate (e.g. 60 fps); however, before digital video is sent to the encoder, frames from the digital video are dropped. In FIG. 18a, the frame rate dropping ratio is 1:2. That is, one out of every two frames is dropped. The frame dropping ratio can be set to drop all frames, drop every second frame (e.g. take a 60 fps video stream to a 30 fps video stream), or 1 in every 3 frames (e.g. take a 60 fps stream to a 40 fps stream). Frame dropping decreases video latency by allowing a larger range of frames to be processed by the system in a given amount of time. For example, suppose the system receives a stream of video frames and can process 200 frames per second. Without frame dropping, after one second the system will have processed the 200$^{th}$ frame of the stream. If the system is set to only process every other frame (i.e. frame dropping ratio 1:2), after one second the system will have processed the 400$^{th}$ frame of the video stream.

FIG. 18b illustrates another way video latency can be reduced. FIG. 18b illustrates reducing frame latency by increasing the compression ratio of the video compression engine 300. Increasing the compression ratio reduces video latency by reducing the average number of bits needed to represent a frame, thereby allowing more frames to be transmitted across the system at given data rate (e.g. Mb/s). The method illustrated in 18b increases the compression ratio by transforming an incoming set of frames at a native color depth into a set of frames comprising two types of frames: a reference frame (an R-frame) with a relatively high comparison depth and an intermediate frame (an I-frame) with a comparison depth that is less than that of the R-frame.

In FIG. 18b, the incoming set of frames is transformed by specifying the comparison depth of an R-frame, the comparison depth of an I-frame, and the number of I-frames for every R-frame. In FIG. 18b, there are three I-frames for every R-frame and the comparison depth of the R-frame is the same as the native color depth (24-bit) and the comparison depth of the I-frame is reduced to 12-bits. It should be noted that the comparison depth of the reference and intermediate frames can be set at any multiple of three (e.g. 9, 12, 15, 18, 21, 24 bit color) and the R-frame color depth need not be the same as the native digital video color depth. The number of I-frames per R-frame typically ranges from 0 to 7. It should be noted that the concept of I-Frames and R-frames can be applied to color depth in addition to or independently of comparison depth.

Figure 19:
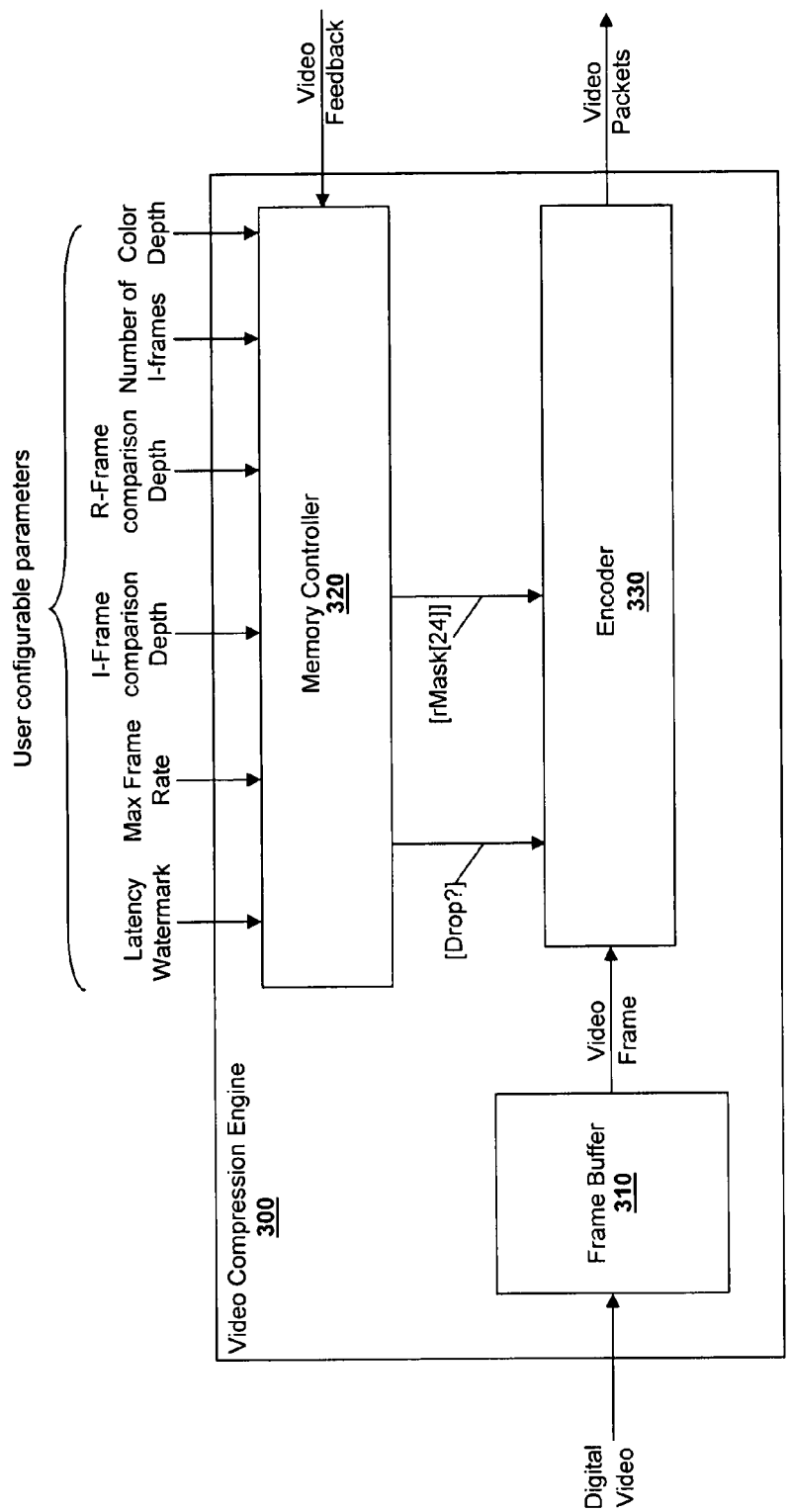
FIG. 19: exemplary video compression engine.

FIG. 19 shows an exemplary video compression engine. In FIG. 19, the user configurable compression parameters described above are stored in registers of memory controller 320. Memory controller 320 uses these parameters along with video feedback information to determine whether a video frame received from frame buffer 310 should be dropped by encoder 330 and to generate the 24-bit rMask. The user configurable parameters in FIG. 19 are: the comparison depth on the reference and intermediate frames (9, 12, 15, 18, 21, 24 bit) the # of Intermediate frames used (range 0 to 7), the watermark for latency between video compression engine 300 and video decompression engine 600 for frame dropping in units of 256 lines, the max frame rate expressed as a ratio with respect to the frame rate being received from the video receiver (i.e. frame-dropping ratio).

When the latency difference between the line being processed by the video compression engine 300 and the line being processed by the video decompression engine 600 is greater than a configurable watermark then a frame will be dropped by video compression engine 300, effectively reducing the frame rate until the latency is below the defined watermark.

A user can also configure the color depth to be used by video compression engine 300 to manage the video experience and associated network bandwidth. Further, the management of bandwidth can be maximized by the use of reference and intermediate frames from the perspective of color depth, where user can specify a number of frames (intermediate frames) between core references frames that carry a specified lower color depth.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A video compression system configured to perform a routine comprising:
   comparing a current pixel to a plurality of reference pixels;
   making n-bit fixed length header packets that define at least the current pixel, said header packets including:
   one of a plurality of variable length opcodes each identifying one of a plurality of encoding commands from a set of available encoding commands including:
      (1) run length commands; and
      (2) short delta commands;
   a variable length payload including:
      (1) for run length commands: a count value specifying how many pixels to perform the run length command; and
      (2) for short delta commands: a delta value for each color channel such that a short delta command can be represented by a single n-bit fixed packet.

2. The video compression system of claim 1, wherein:
   the n-bit fixed length header packet is 8 bits;
   the opcodes for run-length commands are 4 bits; and
   the opcodes for short delta commands are 2 bits.

3. The video compression system of claim 1, wherein said run length commands include:
   (a) copy left command;
   (b) copy old command; and
   (c) copy above command;
   and said short delta commands include:
   (d) short delta with respect to the same pixel in the previous frame; and
   (e) short delta with respect to the pixel to the left of the current pixel.

4. A video compression system configured to perform a routine comprising:
   comparing a current pixel to a plurality of reference pixels;
   making n-bit fixed length header packets that define at least the current pixel, said header packets including:
   one of a plurality of variable length opcodes each identifying one of a plurality of encoding commands from a set of available encoding commands including:
      (1) commands that can be executed with a single n-bit packet, including:
         (a) run length commands; and
         (b) short delta commands;
      (2) commands executed with multiple packets including:
         (c) delta commands;
         (d) make pixel commands;
         (e) make series commands.

* * * * *